(12) United States Patent
Barcley

(10) Patent No.: US 7,161,240 B2
(45) Date of Patent: Jan. 9, 2007

(54) INSITU-COOLED ELECTRICAL ASSEMBLAGE

(75) Inventor: Tina P. Barcley, Mendon, NY (US)

(73) Assignee: Eastman Kodak Company, Rochester, NY (US)

( * ) Notice: Subject to any disclaimer, the term of this patent is extended or adjusted under 35 U.S.C. 154(b) by 237 days.

(21) Appl. No.: 10/184,346

(22) Filed: Jun. 27, 2002

(65) Prior Publication Data

US 2004/0000711 A1   Jan. 1, 2004

(51) Int. Cl.
*H01L 23/34* (2006.01)
*H01L 23/10* (2006.01)
*H01L 23/495* (2006.01)

(52) U.S. Cl. .............. 257/712; 257/707; 257/774; 257/675

(58) Field of Classification Search ........... 257/675, 257/706, 707, 708, 709, 712, 713, 717, 718, 257/720, 723, 796, 774; 438/117, 122–127
See application file for complete search history.

(56) References Cited

U.S. PATENT DOCUMENTS

| | | | |
|---|---|---|---|
| 4,954,878 A | | 9/1990 | Fox et al. |
| 5,065,227 A | | 11/1991 | Frankeny et al. |
| 5,671,121 A | * | 9/1997 | McMahon ............... 257/724 |
| 5,710,459 A | * | 1/1998 | Teng et al. .............. 257/717 |
| 5,870,286 A | | 2/1999 | Butterbaugh et al. |
| 5,930,117 A | * | 7/1999 | Gengel .................... 257/706 |
| 6,043,981 A | * | 3/2000 | Markow et al. ......... 361/704 |
| 6,118,177 A | * | 9/2000 | Lischner et al. ........ 257/706 |
| 6,150,724 A | | 11/2000 | Wenzel et al. .......... 257/777 |
| 6,175,497 B1 | * | 1/2001 | Tseng et al. ............ 257/706 |
| 6,355,984 B1 | * | 3/2002 | Miyamoto et al. ...... 257/777 |
| 6,486,534 B1 | * | 11/2002 | Sridharan et al. ....... 257/659 |

* cited by examiner

*Primary Examiner*—Nitin Parekh
(74) *Attorney, Agent, or Firm*—Paul A. Leipold; Clyde E. Bailey

(57) ABSTRACT

An electrical assemblage reduces heat generated by components during operation. The assemblage has at least one heat-generating component, typically a resistor, and at least one heat-removing element electrically associated with the heat-generating component. Heat-removing element comprises a plurality of vias therein and is fixedly attached to a tip of the electrical components, typically on opposed charged ends. Heat absorbed by the heat-removing element is then transported to a heat sink, cooperatively associated therewith, for disposal. In an electrical assemblage, a circuit board contains multiple heat generating components each being associated with a heat-removing element of the invention.

19 Claims, 2 Drawing Sheets

INSITU-COOLED ELECTRICAL ASSEMBLAGE

CROSS-REFERENCE TO RELATED APPLICATIONS

The present application is related to U.S. application Ser. No. 10/184,290, filed Jun. 27, 2002, by Tina P. Barcley, and entitled, "Cooling-Assisted, Heat-Generating Electrical Component And Method Of Manufacturing Same;" and U.S. application Ser. No. 10/184,357, filed Jun. 27, 2002, by Tina P. Barcley, and entitled, "Method of Cooling Heat-Generating Electrical Components."

FIELD OF THE INVENTION

The invention relates to improvements in heat transfer in electronic technology. More particularly, the invention concerns electrical assemblages, such as circuit boards, which reduce heat generated in ceramic "chip" components during service.

BACKGROUND OF THE INVENTION

It is well known that overheating of electrical components, for instance components mounted on a circuit board, contributes to reducing the life of the component. Overall component reliability is also compromised by excessive overheating during service. As circuit boards become denser and contain components that have higher power output capacity, reliability problems become magnified for solder joints of the circuit board, particularly in "chip" ceramic type parts due to CTE (Coefficient of Thermal Expansion) differences.

The current trend in the industry is to either assume the reliability risk or to institute extremely expensive chip construction processes for removing excess heat. Both practices have proven undesirable from a cost management standpoint.

In a typical electronic package, the largest chip ceramic component, for instance the 2512 resistor, is the least reliable component on most circuit boards and the component most likely to fracture its solder joint due to thermal cycling. The thermal cycling occurs every time the component is used. It would, therefore, be desirable to cool this component during service to dramatically improve its useful life and reliability.

Therefore, a need persists in the art for a system and method of cooling electrical components, such as those mounted in circuit boards, during service that produces a component that is reliable, cost effective and has an extended useful life.

SUMMARY OF THE INVENTION

It is, therefore, an object of the present invention to provide an electrical component protected from deterioration due to overheating during service.

Another object of the invention is to provide such an electrical component that is considerably more reliable, has a longer useful life and is cost effective to build and use.

The present invention is directed to overcoming one or more of the problems set forth above. Briefly summarized, according to one aspect of the present invention, an electrical assemblage has a main portion for supporting at least one heat-generating component thereon. The heat-generating component has a characteristic junction temperature $T_j$ and first and second mating surfaces for affixing heat-removing elements thereto. The heat-removing element is electrically associated with either of the first and second mating surfaces of the heat-generating component and forms a thermal transport path therebetween. A heat sink is arranged in fluid communication with the thermal transport path for absorbing heat transferred to the heat-removing element thereby reducing the junction temperature $T_j$ of the heat-generating component to a temperature $T_1$, wherein $T_1$ is less than $T_j$.

The present invention has numerous advantages over existing developments including reliability, cost effectiveness, ease of development, and increased component useful life. Moreover, the present invention has the advantage of being applicable to practically any ceramic chip, ball grid array (BGA), direct die attached components, chip-on-board, and smaller chip resistors, such as the 2010, 1206, etc.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

Figure 1:
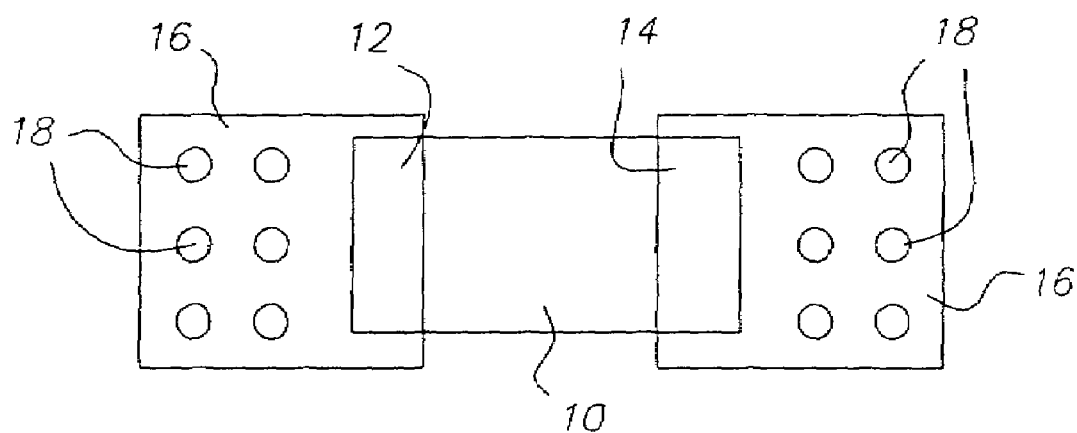
FIG. 1 is an elevated plan view of an electrical component having the heat-removing element of the invention;.
Figure 2:
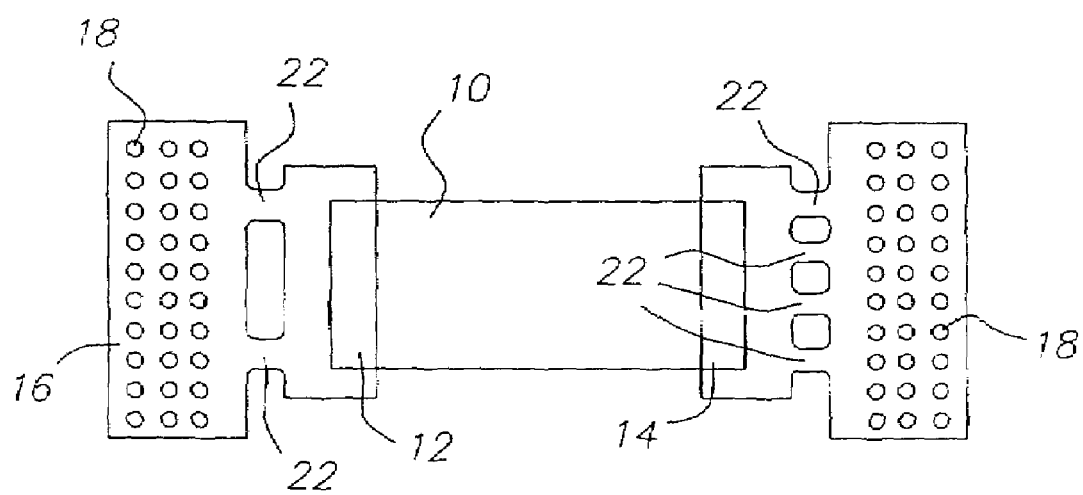
FIG. 2 is an elevated front plan view of an electrical component having alternative heat-removing elements thereon.

Turning now to the drawings, and in particular to FIGS. 1 and 2, the electrical component 10 of the invention is illustrated According to FIG. 1, electrical component 10, for instance a resistor or capacitor, has mating portions 12, 14 and a heat-removing element 16 attached to either of mating portions 12, 14. Electrical component 10 is preferably made of a ceramic or ceramic-like material for suitability of die usage or affixing other electrical components (multi-chip module). Although soldering is the preferred method of attaching heat-removing element 16 to either of mating portions 12, 14, skilled artisans will appreciate that other methods may be used including using electrically conductive adhesives. Mating portions 12, 14 are typically gold or palladium tipped for best thermal conductivity and solderability. Skilled artisans will appreciate that, alternatively, the mating portions 12, 14 may comprise other thermally conductive materials such as tin-lead.

According to FIG. 1, heat-removing element 16 has a plurality of thermal vias 18 that provides the mechanism for effectively removing heat from the electrical component 10. The thermal conductivity of thermal vias 18 is enhanced as possible with the addition of solder or some thermal compound either partially or totally filling the inner walls (not shown) of thermal vias 18. Thermal vias 18 may have practically any size diameter. A preferred range for the diameter is about 0.022 inches to about 0.040 inches.

However, a diameter in the range of about 0.022 inches to about 0.028 inches is more preferred.

Figure 3:
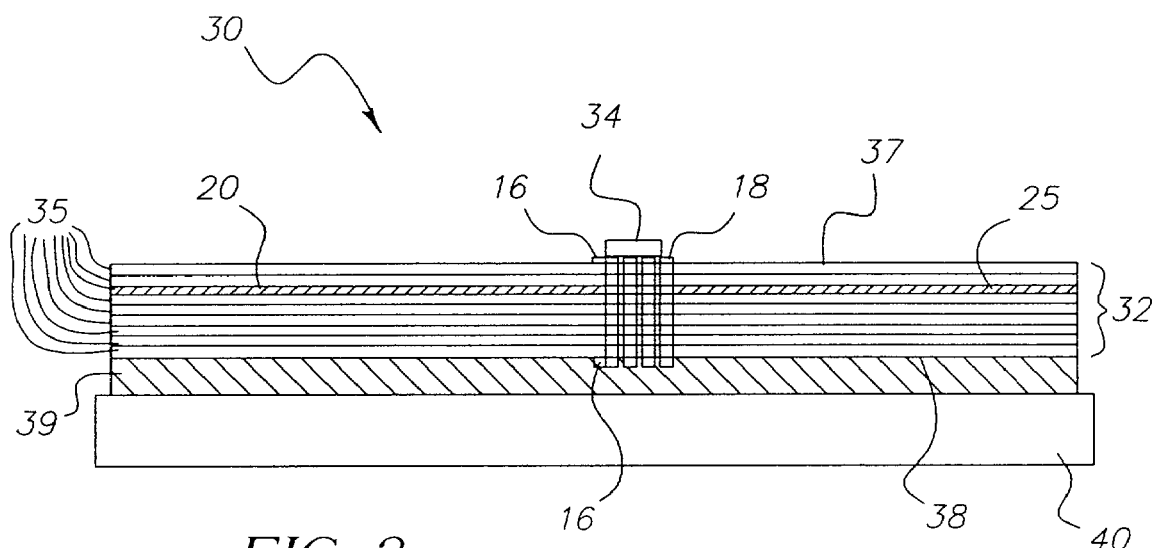
FIG. 3 is a cross-sectional view of a typical circuit board construction having the heat-removing element of the invention thereon; and, FIG. 4 is a plan view of a solder stencil used for automated manufacturing of heat-removing element and thermal vias.

As shown in FIG. 3, skilled artisans will appreciate that thermal vias 18 may be electrically connected to a high density copper plane 20 to increase the thermal conductivity of the vias 18. Therefore, practically any high density copper circuit or collection of signals can be used to increase the thermal conductivity of the vias 18. The maximum effect on thermal conductivity is realized when the thermal vias 18 are connected to a large copper area, such as high-density copper plane 20. Typically, large copper areas are generally used for grounds and power circuits. This construction would also include a bonded heat sink 40, as described below. Use of a thermal conductive bonding adhesive or thermally conductive compound will effectively maximize the heat transfer to the heat sink.

Referring to FIG. 3, an electrical assemblage 30 is illustrated. According to FIG. 3, electrical assemblage 30 includes a main portion, or circuit board 32, and at least one heat-generating component 34, each with the heat-removing elements 16 of the invention. Heat-removing element 16, as described above, has a plurality of thermal vias 18 for transporting heat away from heat-generating component 34. Heat-generating component 34 has a junction temperature $T_j$. To reduce the junction temperature $T_j$ of the heat-generating component 34, the thermal vias 18 transport the heat generated by component 34 to the bottom outer layer 38 of circuit board 32. The heat is then transported from the bottom outer layer 38 to the adjoining heat sink 40. Heat sink 40 may be adjoined to bottom outer layer 38 with, for instance, a thermally conductive adhesive material. In this way, the junction temperature $T_j$ of the heat-generating component 34 is reduced to a temperature $T_1$, wherein $T_1$ is less than $T_j$.

As an example, a 10-layer polyimide circuit board 32 may comprise ½ oz. copper on the inner layers 35 and 1 oz. copper on the outer layers 37 (top), 38 (bottom). The heat-removing element 16 of the invention can be used with any material circuit board since the primary heat transfer mechanism is conduction through the thermal vias 18. Moreover, heat-removing element 16 can be used on any number of layers or copper weight available from any circuit board manufacturer. Current industry standards for circuit board plating include Pd, NiAu, Immersion Tin, Immersion Ag, and HASL for plating types. The specific board material was polyimide, but any board material where vias can be drilled could use this invention (FR2, FR4, CEM, Rogers, etc.). For the electrical assemblage 30 of the invention, a particular pattern of thermal vias 18 is used on the heat-removing element 16. The thermal vias 18 are preferably about 0.025 inches in diameter with a grid spacing of about 0.040 inches center-to-center for the hole pattern (see for instance, FIGS. 1 and 2). This hole pattern provides a specific cross-sectional area of copper in the circumference of the thermal vias 18 to conduct the heat from the top outer layer 37 of the circuit board 32 to the bottom outer layer 38. The copper of heat-removing element 16 is used to transport heat across the surface of the circuit board 32. Additionally, the similar heat-removing elements on the bottom outer layer 38 of the circuit board 32 enhance the transport of the heat from the thermal vias 18 to the heat sink 40.

Referring again to FIGS. 1 and 2, heat-removing element 16 may have practically any geometric configuration. In FIG. 1, heat-removing element 16 is substantially rectangular shaped. As shown in FIG. 2, alternatively, heat-removing element 16 may be substantially T-shaped. In this latter design the T-shaped pads are used to separate the thermal vias 18 from mating surfaces 12, 14 to improve solderability and manufacturability. Typically one would stay away from the actual solder joint (not shown), i.e., the interface of the mating surface 12, 14 and the heat-removing element 16 of the electrical component 10 in order to maintain solder joint integrity. Separation of thermal vias 18 from the mating surfaces 12, 14 may be accomplished by use of webs 22, typically comprising copper, on circuit board 32. Any number of webs 22 may be used depending on the application.

Referring to FIG. 3, electrical assemblage 30 of the invention has an aluminum heat sink 40 that is 0.090 inches thick. The heat sink 40 was attached via adhesive layer 39 to the circuit board 32 using an Arlon Thermobond® silicone, thermally conductive, electrically isolative adhesive film. Any metal heat sink 40 could have been used of any thickness, preferably between 0.060 inches and 0.090 inches. Additionally, any thermally conductive compound or adhesive (including epoxies and liquid silicones) could be used with substantially similar results. Those skilled in the art will appreciate that thermally conductive, electrically conductive adhesives may be used as a substitute for thermally conductive compounds.

Figure 4:
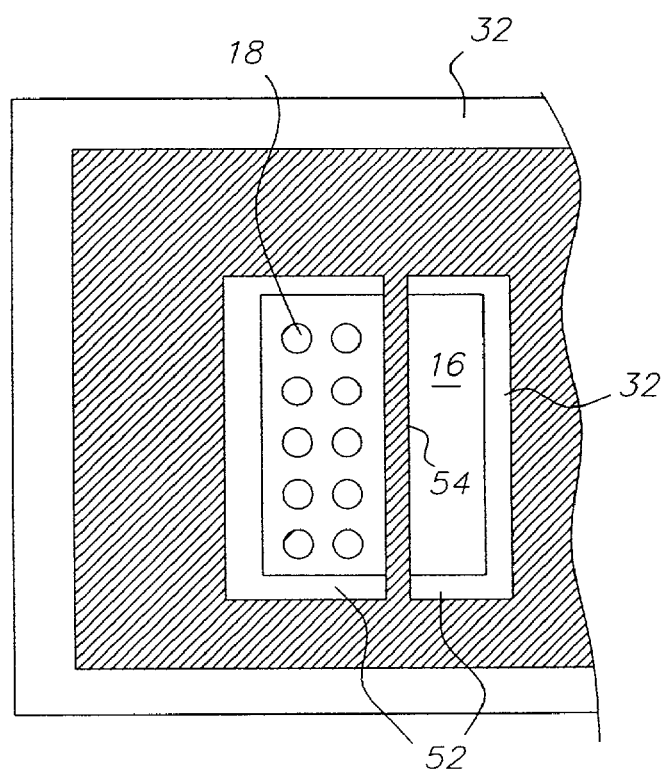

Turning now to FIG. 4, to construct electrical assemblage 30 of the invention, a solder stencil 50 may be used to automatically apply solder paste to the circuit board 32 in high volume electronic applications. Solder stencil 50 has at least one cut-out portion 52 (two are shown) which provides a path for the solder paste to be applied to the heat-removing elements 16 of circuit board 32. Although this process may be accomplished manually, solder stenciling has the advantage of consistency and ease of use. The solder stencil 50 has standard support features that reduces sagging in the vicinity of the cut-out portions 52. The amount of solder paste applied to the heat-removing elements 16 can be increased by increasing the size of the cut-out portions 52. The increased amount of solder paste associated with the increased sizes of the cut-out portions 52 will accommodate the volume of paste that eventually fills the thermal vias 18.

The invention has been described with reference to a preferred embodiment. However, it will be appreciated that variations and modifications can be effected by a person of ordinary skill in the art without departing from the scope of the invention.

PARTS LIST

| | |
|---|---|
| 10 | electrical component |
| 12, 14 | mating portion of 10 |
| 16 | heat-removing element |
| 18 | thermal vias |
| 20 | high density copper plane |
| 22 | webs of heat-removing element 16 |
| 30 | electrical assemblage |
| 32 | circuit board |
| 34 | heat-generating component |
| 35 | inner layers of circuit board 32 |
| 37 | top outer layer of circuit board 32 |
| 38 | bottom outer layer of circuit board 32 |
| 39 | adhesive layer |
| 40 | heat sink |
| 50 | solder stencil |
| 52 | cut-out portion of solder stencil 50 |

What is claimed is:

1. An electrical assemblage, comprising:
a main portion having a top surface and a bottom surface for supporting at least one component on said top surface, said at least one component having a junction temperature $T_j$ and first and second mating surfaces;
means for reducing said junction temperature $T_j$ of said at least one component comprising at least one two-piece heat removing element comprising a top pad on said top surface and a bottom pad on said bottom surface, said top pad having a first end, a second end and a web intermediate said ends, said first end being bonded to said main portion and having a plurality of thermal vias therein extending between said top and bottom pads, said second end being electrically associated with either of said first and second mating surfaces of said at least one component and forming a thermal transport path therebetween said plurality of thermal vias being separated from said either of said first and second mating surfaces by said web; and,
a heat sink adjacent to and bonded to said bottom pad, said thermal transport path extending from said top pad through said thermal vias to said bottom pad and from said bottom pad to said adjacent heat sink, said heat sink absorbing heat transferred along said thermal transport path for reducing said junction temperature $T_j$ of said at least one component to a temperature $T_1$, wherein $T_1$ is less than $T_j$.

2. The electrical assemblage recited in claim 1 wherein said plurality of thermal vias are arranged in a grid-like pattern with each one of said plurality of thermal vias having a diameter of about 0.022 inches.

3. The electrical assemblage recited in claim 2, wherein nearest adjacent thermal vias are spaced about 0.040 inches apart as measured from a center portion of a first thermal vias to a second center portion of a nearest adjacent second thermal vias.

4. The electrical assemblage recited in claim 2 wherein each one of said plurality of thermal vias is filled with a solder material.

5. The electrical assemblage recited in claim 2 wherein each one of said plurality of thermal vias has an electrical path terminating on a copper coated portion of said main portion.

6. The electrical assemblage recited in claim 1 wherein said heat sink comprises aluminum having a thickness of about 0.090 inches.

7. The electrical assemblage recited in claim 1 wherein said heat sink is bonded to said bottom pad with a silicon based, thermally conductive, electrically isolating adhesive film material.

8. The electrical assemblage recited in claim 7 wherein said adhesive film material comprises 0.007 inch diameter glass beads incorporated therein to facilitate bonding.

9. The electrical assemblage recited in claim 1 wherein said main portion is a polyimide circuit board having a plurality of copper layers.

10. The electrical assemblage recited in claim 9 wherein said plurality of copper layers comprises an outer layer having a weight of about one oz and inner layers beneath said outer layer having a weight of about ½ oz.

11. The electrical assemblage recited in claim 1 wherein said top pad of said heat removing element is T-shaped with said first end forming a head of the T and said web and said second end forming a body of the T.

12. The electrical assemblage recited in claim 1 wherein said web has an opening.

13. The electrical assemblage recited in claim 1 wherein said web has a plurality of openings.

14. The electrical assemblage recited in claim 1 wherein said web has a plurality of openings and wherein said top pad of said heat removing element is T-shaped with said first end forming a head of the T and said web and said second end forming a body of the T.

15. An electrical assemblage, comprising:
a circuit board having a top surface and a bottom surface for supporting at least one component on said top surface;
at least one two-member heat removing element having a top pad on said top surface and a bottom pad on said bottom surface, said top pad having a first end, a second end and a web intermediate said ends, said first end being bonded to said top surface of said circuit board, said second end being electrically associated with either of a first and a second mating surface of said at least one component;
a plurality of thermal vias extending between said top and bottom pads forming a thermal transport path therebetween for transferring heat to said bottom pad, said plurality of thermal vias being separated from said either of said first and second mating surfaces by said web; and
a heat sink bonded to said bottom pad for absorbing heat transferred to said bottom pad through said thermal vias from said at least one component.

16. The electrical assemblage recited in claim 15 wherein said top pad of said heat removing element is T-shaped with said first end forming a head of the T and said web and said second end forming a body of the T.

17. The electrical assemblage recited in claim 15 wherein said web has an opening.

18. The electrical assemblage recited in claim 11 wherein said web has a plurality of openings.

19. The electrical assemblage recited in claim 15 wherein said web has a plurality of openings and wherein said top pad of said heat removing element is T-shaped with said first end forming a head of the T and said web and said second end forming a body of the T.

* * * * *